(12) United States Patent
Geiger et al.

(10) Patent No.: US 9,783,410 B2
(45) Date of Patent: Oct. 10, 2017

(54) METHOD FOR PRODUCING A COMPONENT

(71) Applicant: NORTHROP GRUMMAN LITEF GMBH, Freiburg (DE)

(72) Inventors: Wolfram Geiger, Ebringen (DE); Uwe Breng, Gundelfingen (DE); Martin Hafen, Rustenhart (FR); Guenter Spahlinger, Stuttgart (DE)

(73) Assignee: NORTHROP GRUMMAN LITEF GMBH (DE)

( * ) Notice: Subject to any disclaimer, the term of this patent is extended or adjusted under 35 U.S.C. 154(b) by 0 days.

(21) Appl. No.: 15/121,638

(22) PCT Filed: Feb. 11, 2015

(86) PCT No.: PCT/EP2015/000305
§ 371 (c)(1),
(2) Date: Aug. 25, 2016

(87) PCT Pub. No.: WO2015/128064
PCT Pub. Date: Sep. 3, 2015

(65) Prior Publication Data
US 2016/0368761 A1 Dec. 22, 2016

(30) Foreign Application Priority Data
Feb. 25, 2014 (DE) .................. 10 2014 002 824

(51) Int. Cl.
*B81B 3/00* (2006.01)
*H01L 21/00* (2006.01)
*B81C 1/00* (2006.01)

(52) U.S. Cl.
CPC ........ *B81B 3/0086* (2013.01); *B81C 1/00333* (2013.01)

(58) Field of Classification Search
CPC .......... B81B 7/0006; B81B 2201/0235; B81C 2203/0118; B81C 2203/0154
See application file for complete search history.

(56) References Cited

U.S. PATENT DOCUMENTS 7,422,928 B2 * 9/2008 Oka ...................... B81B 3/0086
359/223.1
7,456,042 B2 * 11/2008 Stark ...................... B81B 3/0021
257/E21.192

(Continued)

FOREIGN PATENT DOCUMENTS

CN       1856440 A      11/2006
CN       101179037 A     5/2008

(Continued)

OTHER PUBLICATIONS

International Search Report for Application No. PCT/EP2015/000305 dated Jul. 4, 2015.

(Continued)

*Primary Examiner* — Savitr Mulpuri
(74) *Attorney, Agent, or Firm* — Tarolli, Sundheim, Covell & Tumino LLP (57) ABSTRACT

In a method for producing a component, a first layer composite is first produced, comprising a structured layer and a trench filled with an insulating material. The structured layer is electrically conductive at least in a first region. The trench filled with an insulating material extends outwards from a first surface of the structured layer and is arranged in the first region of the structured layer. The first surface of the structured layer faces a first surface of the first layer composite. The method additionally has the step of producing a second layer composite, which has a first depression in a first surface of the second layer composite, and the step of connecting the first layer composite to the second layer composite. The first surface of the first layer composite (Continued)

adjoins the first surface of the second layer composite at least in some regions, said filled trench being arranged within the lateral position of the first depression. After the first layer composite has been connected to the second layer composite, the thickness of the first layer composite from a second surface of the first layer composite to the depth of the filled trench is reduced. The second surface of the first layer composite lies opposite the first surface of the first layer composite. The method further has the step of producing an active structure in the structured layer, said active structure comprising two second regions which are arranged in the first region of the structured layer and which are mechanically connected to each other in a rigid manner but are electrically insulated from each other by means of the filled trench.

6 Claims, 4 Drawing Sheets

(56) References Cited

U.S. PATENT DOCUMENTS

| | | | | |
|---|---|---|---|---|
| 7,704,774 | B2* | 4/2010 | Mayer | B81C 1/0023 257/E21.001 |
| 7,824,943 | B2* | 11/2010 | Lutz | B81B 3/0021 257/E21.192 |
| 7,915,080 | B2* | 3/2011 | Takahashi | H01L 21/56 257/E21.705 |
| 7,964,428 | B2* | 6/2011 | Breng | B81C 1/00333 438/51 |
| 8,558,327 | B2* | 10/2013 | Knese | B81B 3/0086 257/414 |
| 8,928,042 | B2* | 1/2015 | Kandori | B81B 3/0086 257/254 |
| 9,034,757 | B2* | 5/2015 | Reinmuth | H01L 21/76224 438/667 |
| 9,406,662 | B2* | 8/2016 | Marion | H01L 24/13 |
| 9,550,667 | B1* | 1/2017 | Chou | H01L 43/02 |
| 2007/0128831 | A1 | 6/2007 | Oka et al. | |
| 2009/0152705 | A1* | 6/2009 | Breng | B81C 1/00333 257/690 |
| 2010/0117116 | A1* | 5/2010 | Glaser | H01L 27/0255 257/109 |
| 2016/0362291 | A1* | 12/2016 | Spahlinger | B81B 3/0086 |

FOREIGN PATENT DOCUMENTS

| | | |
|---|---|---|
| CN | 101281866 A | 10/2008 |
| CN | 101687629 A | 3/2010 |
| DE | 10 2005 015584 A1 | 10/2006 |
| DE | 10 2007 030121 A1 | 1/2009 |
| DE | 10 2012 210480 A1 | 12/2013 |
| EP | 1 663 850 A1 | 6/2006 |
| JP | 2010-528888 A | 8/2010 |

OTHER PUBLICATIONS

Chinese Office Action for Application No. 201580006667.5 dated Feb. 14, 2017.

Canadian Office Action for Application No. 2,937,361 dated May 16, 2017.

Japanese Office Action for Application No. 2016-553813 dated Jul. 18, 2017.

* cited by examiner

METHOD FOR PRODUCING A COMPONENT

RELATED APPLICATIONS

The present invention is a U.S. National Stage under 35 USC 371 patent application, claiming priority to Ser. No. PCT/EP2015/000305, filed on 11 Feb. 2015; which claims priority from DE 10 2014 002 824.0, filed 25 Feb. 2014, the entirety of both of which are incorporated herein by reference.

The invention relates to a method for producing a component, in particular, a micro-mechanical, micro-electromechanical (MEMS) or rather micro-opto-electro-mechanical (MOEMS) component.

Micro-electromechanical components (MEMS) or rather micro-opto-electro-mechanical components (MOEMS) often comprise active structures. In particular, mobile structures or structures, which equally include mobile and optical components (e.g. mobile mirrors), are to be understood by "active structure". The term "active area" designates the area or rather volume of the component, in which the active structure lies or rather moves. It can be necessary or advantageous, if the active structure does not consist of a uniform composite, but has at least two separate parts or regions, which are mechanically connected to each other in a rigid manner, but are fully electrically insulated from each other.

The formation of an electrical insulation between the parts of the active structure electrically insulated from each other presents a particular challenge in the production of such a component, since the active structure is physically connected to other elements of the component to a limited extent only, in order to guarantee their mobility.

Therefore, it is the object of the invention to provide a method for producing a component, in particular, a micromechanical, micro-electromechanical or micro-opto-electromechanical component, by which an active structure of the component with two separate parts or regions, which are mechanically connected to each other in a rigid manner, but are fully electrically insulated from each other, can be realized.

The object is solved by the subject matter of the independent claim. Preferred embodiments can be found in the sub-claims.

A method for producing a component according to the present invention comprises the step of producing a first layer composite, which comprises a structured layer, which is electrically conductive at least in a first region, and a trench filled with an insulating material, which extends outwards from a first surface of the structured layer and is arranged in the first region of the structured layer. The first surface of the structured layer faces a first surface of the first layer composite. The method for producing a component additionally has the step of producing a second layer composite, which has a first depression in a first surface of the second layer composite, and the step of connecting the first layer composite to the second layer composite, the first surface of the first layer composite adjoining the first surface of the second layer composite at least in some regions, and the filled trench being arranged within the lateral position of the first depression. After the first layer composite has been connected to the second layer composite, the thickness of the first layer composite from a second surface of the first layer composite to the depth of the filled trench is reduced, the second surface of the first layer composite lying opposite the first surface of the first layer composite. The method further has the step of producing an active structure of the component in the structured layer, the active structure being arranged within the lateral position of the first depression and comprising two second regions of the structured layer. The second regions of the structured layer are arranged in the first region of the structured layer, physically connected to each other in a rigid manner, and electrically insulated from each other by means of the filled trench.

According to an embodiment of the method for producing a component, the filled trench in the first layer composite can, prior to the step of connecting the first layer composite to the second layer composite, extend to a depth, which is smaller than the thickness of the first layer composite. This means that the filled trench does not reach to a second surface of the first layer composite, which lies opposite the first surface of the first layer composite.

According to a specific embodiment, the first layer composite further comprises an auxiliary layer adjoining a second surface of the structured layer, the second surface of the structured layer lying opposite the first surface of the structured layer. The filled trench extends to the second surface of the structured layer.

According to an embodiment of the method, no further structures, in addition to the trench filled with an insulating material, are formed in the first layer composite prior to connecting the first layer composite to the second layer composite. In particular, no dividing trenches, i.e. trenches not filled with an insulating material, are formed.

In this case, the structured layer—after reducing the thickness of the first layer composite to the depth of the filled trench—is structured, in order to produce the active structure of the component.

According to another embodiment of the method, dividing trenches are, in addition to the filled trenches, formed in the first layer composite prior to connecting the first layer composite to the second layer composite, which are not filled with a material and extend from the first surface of the first layer composite to a depth, which is equal to or greater than a depth of the filled trench. The dividing trenches define the lateral limitation of the active structure produced in a subsequent method step.

In this case, the active structure of the component can be produced by reducing the thickness of the first layer composite to the depth of the filled trench.

According to an embodiment, the method for producing a component additionally has the step of producing a third layer composite, which has a first surface, and the step of connecting the first layer composite to the third layer composite after producing the active structure, the first surface of the third layer composite adjoining the second surface of the first layer composite at least in some regions. Thus, the structured layer can be encapsulated in a hermetically sealed manner.

Prior to connecting the first layer composite to the third layer composite, a second depression can be produced in the first surface of the third layer composite. During connecting the first layer composite to the third layer composite, the active structure is arranged within the lateral position of the second depression.

According to an embodiment, the layer of the first layer composite facing the third composite layer, and the layer of the third layer composite facing the first composite layer consist of the same material.

According to another embodiment, the layer of the first layer composite facing the second composite layer, and the layer of the second layer composite facing the first composite layer consist of the same material.

In case that the layers to be connected to each other, i.e. the layer of the first layer composite facing the second layer composite, and the layer of the second layer composite facing the first layer composite, and, where applicable, the layer of the first layer composite facing the third layer composite, and the layer of the third layer composite facing the first layer composite, consist of the same material, particularly suited methods for connecting those layers, e.g. bonding processes, can be used. For example, the corresponding layers can consist of a semiconductor material, in particular, silicon.

Embodiments of the method according to the invention are explained in more detail in the following text based on the figures, with similar elements being designated with identical reference numerals.

Figure 1:
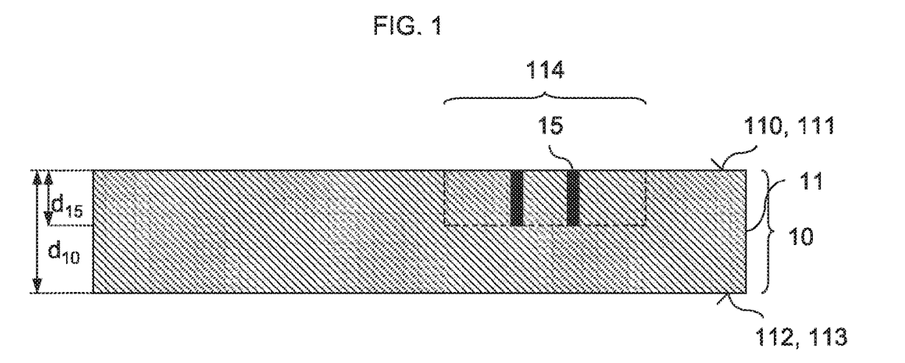
FIG. 1 shows a first layer composite according to an embodiment of the method in cross section.

FIG. 1 shows a cross section through a first layer composite 10 produced according to a first embodiment. The first layer composite 10 illustrated in FIG. 1 comprises a structured layer 11 and a trench 15 filled with an insulating material. FIG. 1 shows two filled trenches 15, however, one filled trench is already sufficient for the method according to the invention. The first layer composite 10 has a first surface 110 and a second surface 112, which lies opposite the first surface 110 of the first layer composite 10. The structured layer 11 has a first surface 111 and a second surface 113, which lies opposite the first surface 111. In the embodiment illustrated in FIG. 1, the first layer composite only comprises the structured layer 11, so that the first surface 111 of the structured layer 11 corresponds to the first surface 110 of the first layer composite 10, and the second surface 113 of the structured layer 11 corresponds to the second surface 112 of the first layer composite 10.

The structured layer 11 has at least a first region 114, which is electrically conductive, and in which the filled trench 15 is formed. A plurality of filled trenches 15 can be formed in the very same first region 114, as illustrated in FIG. 1. However, various filled trenches 15 can also be formed in various first regions 114, which are electrically insulated from each other. The first region(s) 114 can extend outwards from the first surface 111 of the structured layer 11 and can reach to a depth d15 of the filled trenches 15, as illustrated in FIG. 1. However, the first region(s) 114 can also reach to another depth, which is different from the depth d15 of the filled trenches 15, or can be formed as buried regions, which do not adjoin any of the first or second surface 111 and 113, respectively, of the structured layer 11. The first region(s) 114 can, for example, be doped areas in a semiconductor layer or in a semiconductor substrate, e.g. made of silicon. It is also possible that the entire structured layer 11 is electrically conductive, and the first region 114 thus extends across the entire structured layer 11.

The term "structured layer" describes formations consisting of one material only, e.g. a silicon wafer, which, however, can also include a composite made of a plurality of layers and materials, as long as the first region 114 in the structured layer 11 is electrically conductive.

In a subsequent process step, an active structure of a component is produced in the first region 114, with the filled trench electrically insulating individual regions of the active structure from each other. Also a plurality of active structures can be produced. Thus, the number of filled trenches results from the number of regions to be produced later of one or more active structures in the structured layer, whereas the regions should be physically connected to each other in a rigid manner, but electrically insulated from each other. This means, the number of the filled trenches 15, of the first regions 114, of the regions of an active structure insulated from each other, and of the active structures is not restricted.

The filled trench(es) are filled with an insulating material and extend from the first surface 111 of the first substrate 11 to the depth d15. According to an embodiment, the depth d15 of the filled trenches 15 is smaller than a thickness d10 of the first layer composite 10. For this reason, the filled trenches 15 do not reach to the second surface 112 of the first layer composite 10. In the top view, the filled trenches 15 can be arranged arbitrarily and have any forms. For example, they can run in a straight or curved line in the top view, and, if a plurality of filled trenches 15 are formed, can be formed parallel or at an angle to each other. The filled trenches 15 can—in cross section—extend outwards arbitrarily from the first surface 111. This means, the filled trenches 15 can run in a straight or curved line perpendicular to the first surface 111 or at a defined angle to that surface. The width of the filled trenches 15 can vary through their depth. In addition, various filled trenches 15 can be formed differently, with the depth of all filled trenches 15 being preferably the same.

The filled trenches 15 can be produced with the aid of an etching process, e.g. a dry etching process (DRIE) or a strongly anisotropic wet etching process using a mask, or with the aid of other processes and a subsequent filling process of the trenches emerged with an insulating material. The trenches are produced from the first surface 111 of the structured layer 11. The insulating material, by which the trenches are filled, can, for example, be filled into the trenches with the aid of a chemical or physical vapor deposition (CVD and PVD, respectively) method. Subsequently to the filling of the trenches with an insulating material, excessive insulating material located on the first surface 111 is removed again. This can be conducted with the aid of a chemo-mechanical polishing (CMP) process or with the aid of an etching process.

The result of this process step is illustrated in FIG. 1.

Optionally, further structures can be produced in the first layer composite 10. For example, further trenches, which extend from the first surface 110 of the first layer composite 10 or from the first surface 111 of the structured layer 11, but are not filled with a material, or further electrically conductive regions can be formed in the structured layer 11, in which, however, no trenches 15 filled with an insulating material are arranged. This is explained in more detail later with reference to FIGS. 10 to 12.

Figure 2:
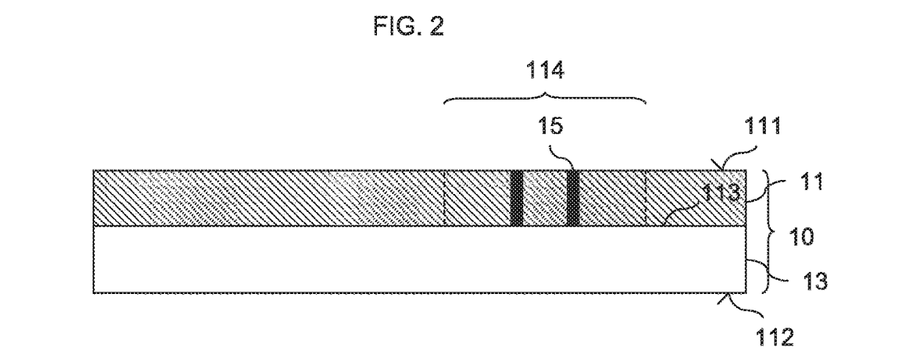
FIG. 2 shows a first layer composite according to another embodiment of the method in cross section.

FIG. 2 shows another embodiment of the first layer composite 10 as a result of the first process step of the method according to the invention. In addition to the structured layer 11 and the filled trench 15, the layer composite 10 comprises an auxiliary layer 13 adjoining the second surface 113 of the structured layer 11. According to the embodiment illustrated in FIG. 2, the first surface 111 of the structured layer 11 corresponds to the first surface 110 of the first layer composite 10, while the second surface 113 of the structured layer 11 faces the second surface 112 of the first layer composite 10, but does not correspond to it.

The auxiliary layer 13 can consist of an insulating material, e.g. silicon oxide, or of any other material, as long as it adheres well to the structured layer 11, and can be removed again in a subsequent process step. In addition, the auxiliary layer 13 can consist of a plurality of layers. The filled trench(es) 15 can extend to any depth in the first layer composite 10. Preferably, they extend to the second surface 113 of the structured layer 11, as illustrated in FIG. 2. However, they can also extend to a depth, which is smaller or greater than a thickness of the structured layer 11.

Regarding the first region 114 of the structured layer 11 as well as the position and form of the filled trenches 15 and their production, the above statements apply.

Optionally, the first layer composite 10 illustrated in FIG. 1 or 2 can also comprise one or more further layers, which can be arranged arbitrarily. For example, an additional layer can be arranged on the first surface 111 of the structured layer 11 and adjoin the first surface 110 of the first layer composite 10. Thus, the first surface 111 of the structured layer 11 does not correspond to the first surface 110 of the first layer composite 10, but faces it, however, is distanced from it due to the additional layer. The additional layer can consist of an insulating material and be applied after the production of the filled trenches 15, so that the filled trenches 15 extend outwards from the first surface 111 of the structured layer 11. However, the additional layer can also have been applied prior to the production of the filled trenches 15, so that the filled trenches 15 extend outwards from the first surface 110 of the first layer composite 10.

Figure 3:
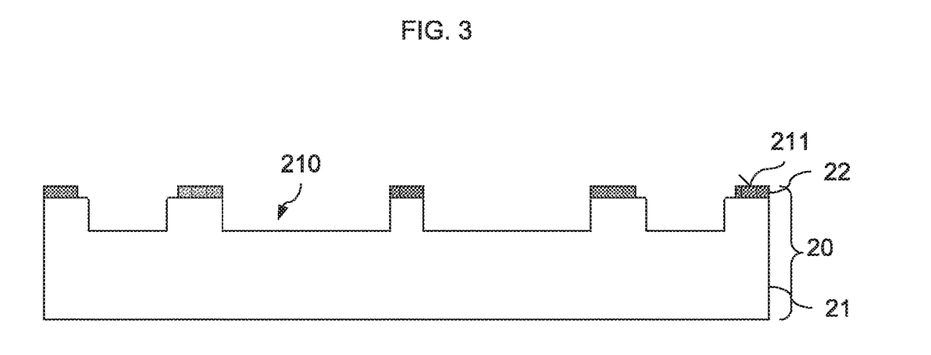
FIG. 3 shows a second layer composite according to an embodiment of the method in cross section.

In a second process step, whose result is illustrated in FIG. 3, a second layer composite 20 is produced. The second layer composite 20 can, as illustrated in FIG. 3, comprise a first substrate 21 made of an electrically conductive material, for example, and a first layer 22 made of an insulating material, for example. Also other material combinations are possible, for example, the first substrate 21 can consist of an electrically insulating material, and the first layer 22 of an electrically conductive material.

In this connection, the term "substrate" describes structures, which consist of one material only, for example, a silicon wafer or a glass plate, which, however, can also include a composite of a plurality of layers and materials. However, the second layer composite 20 can also consist of a first substrate 21 only.

The second layer composite 20 has a first depression 210, which is formed in a first surface 211 of the second layer composite 20. The first depression 210 has a depth, which is smaller than a thickness of the second layer composite. The second layer composite 20 can also have a plurality of first depressions 210 as well as further depressions, whereas the further depressions can have the same depth as the first depression 210 or a depth different therefrom.

The step of producing the second layer composite 20 is chronologically independent of the step of producing the first layer composite 10, and can be made prior to or following such step.

Figure 4:
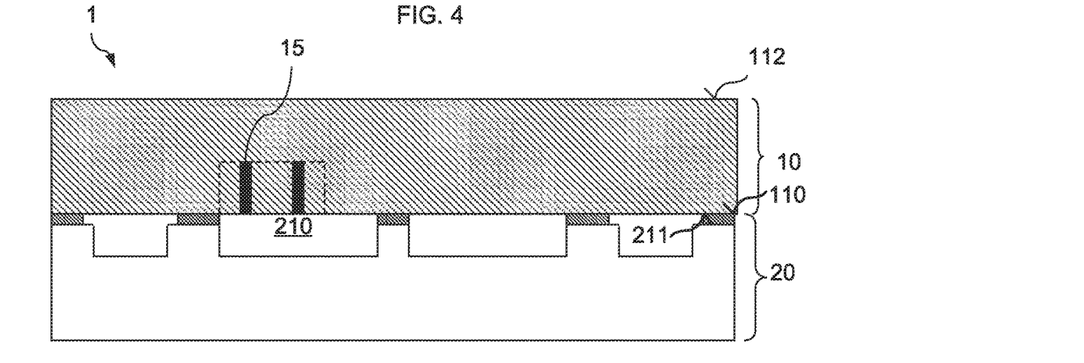
FIG. 4 shows a component according to an embodiment of the method in cross section after connecting the first and the second layer composite.

In a further process step, whose result is illustrated in FIG. 4, the first layer composite 10 is connected to the second layer composite 20, and a component 1 is produced. For the illustration in FIG. 4, the first layer composite 10 illustrated in FIG. 1 and the second layer composite 20 illustrated in FIG. 3 have been selected. However, the first layer composite 10 and the second layer composite 20 can be formed arbitrarily, as described above. As a result, the first surface 110 of the first layer composite 10 adjoins the first surface 211 of the second layer composite 20 at least in some regions, with the filled trench(es) 15 being arranged within the lateral position of the first depression 210 in the second layer composite 20. Thus, it is ensured that an active structure, which is produced in a subsequent process step in the structured layer 11 and comprises at least one filled trench 15, can move freely with regard to the second layer composite 20, and does not abut on the first surface 211 of the second layer composite 20.

For connecting the first and the second layer composite 10 and 20, joining processes on the basis of direct bonding processes as well as anodic bonding processes can be used, for example. Thus, in particular MEMS or MOEMS components can be produced in a cost-efficient manner. Furthermore, such a joining process enables a stable and hermetically sealed connection of the first and of the second layer composite 10 and 20 to each other.

Since the filled trenches 15 preferably do not extend to the second surface 112 of the first layer composite 10, particularly suited parameters can be used during the process of connecting the first and the second layer composite 10 and 20, for example, high contact pressures and/or air underpressures during a bonding process.

Since in the currently described embodiment of the method up to that process step no further structures except for the trenches 15 filled with an insulating material are formed in the first layer composite 10, in particular, no trenches not filled with a material, the first layer composite 10 has an increased stability during the connecting process, which enables the use of particularly suited process parameters.

It is particularly advantageous for a bonding process, if the layers of the first layer composite 10 and of the second layer composite 20 to be connected to each other consist of the same material. This means, the layer of the first layer composite 10 facing the second composite layer 20, and the layer of the second layer composite 20 facing the first composite layer 10 can consist of the same material, for example of silicon.

Figure 5:
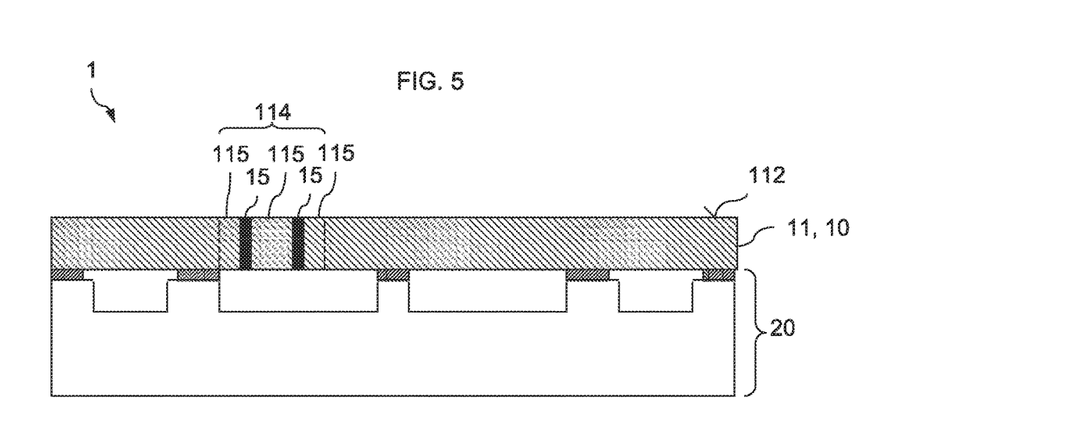
FIG. 5 shows the component from FIG. 4 in cross section after reducing the thickness of the first layer composite.

In a next process step, whose result is illustrated in FIG. 5, the first layer composite 10 is thinned outwards from the second surface 112 to the depth d15 of the filled trenches 15, i.e. the thickness of the first layer composite 10 is reduced to a thickness, which corresponds to the depth d15 of the filled trenches 15. This can be conducted with the aid of a CMP process or an etching process, for example. The material of the first layer composite 10 is removed until the filled trenches 15 are reached. As a result, the filled trenches 15 adjoin the second surface 112 of the first layer composite 10, and, thus, electrically insulate specific second regions 115 of the structured layer 11 from other regions of the structured layer 11 within the first region 114 of the structured layer 11 at least in certain regions. "At least in certain regions" means here that the second regions 115 can be possibly connected at another cross-sectional level, in which the filled trenches 15 are not formed, nor electrically conductive to each other. This can, in particular, be the case when no other structures except for the filled trenches 15 have yet been produced in the first layer composite 10.

Figure 6:
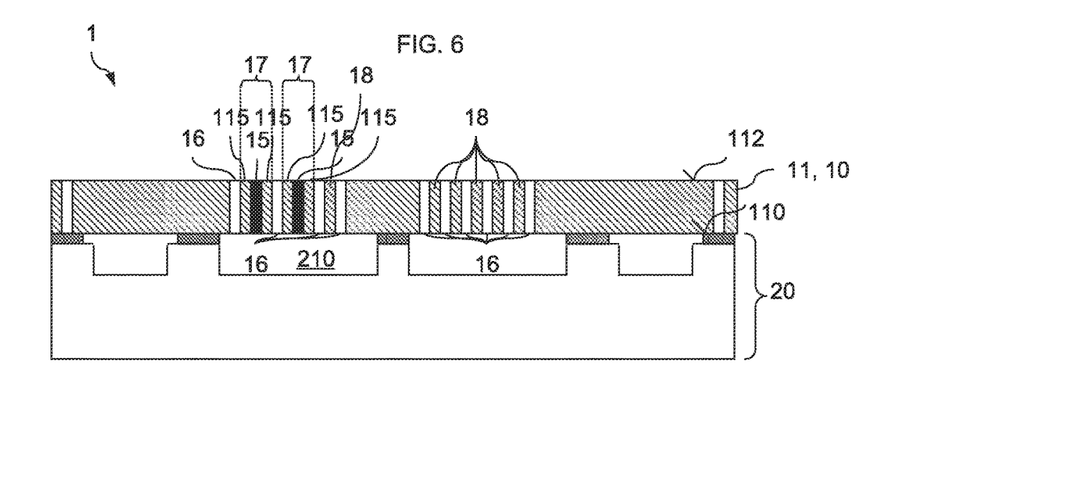
FIG. 6 shows the component from FIG. 5 in cross section after structuring the structured layer according to an embodiment of the method.

The result of a process step for producing further structures in a first layer composite 10 is illustrated in FIG. 6. In particular, dividing trenches 16 in the first layer composite 10, which, for example, can only comprise the structured layer 11, can be formed by means of an etching process, with the dividing trenches 16 not being filled with a material, and, thus, physically divide individual regions or structures in the first layer composite 10 from each other. Thus, for example, one or more active structures 17 and other structures 18 can be produced, which can be mobile as well. In FIG. 6 two active structures 17 and six other structures 18 are illustrated, however, the number of the active structures 17 and of the other structures 18 is not restricted, and the other structures 18 can, for example, not be formed at all.

The two illustrated active structures 17 each comprise two second regions 115 of the structured layer 11, with the second regions 115 being arranged at least partly in the first region 114 of the structured layer 11. Preferably, the second regions 115 are fully electrically conductive, i.e. they are fully arranged in the first region 114 of the structured layer 11. The dividing trenches 16 are arranged so that they laterally limit the active structures 17 and—in connection with the filled trench 15—electrically insulate the second regions 115 of one of the active structures 17 from each other, however, the second regions 115 of the specific active structure 17 being physically connected to each other in a rigid manner. Thus, different potentials can be applied to different second regions 115 of the active structure 17, for example, via electrically conductive springs, which connect the second regions 115 of the active structure 17 to corresponding electrodes and enable movement of the active structure 17. In order to enable movement of the active structure also in a direction perpendicular to a first surface 110 of the first layer composite 10, the active structure 17 is arranged within the lateral position of the first depression 210 in the second layer composite 20.

Figure 7:
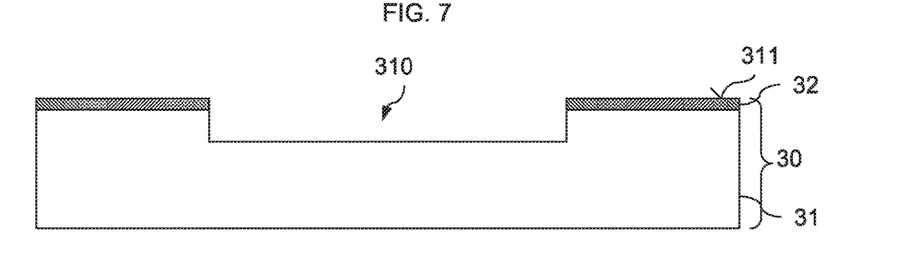
FIG. 7 shows a third layer composite according to an embodiment of the method in cross section.

In a further process step of the method for producing a component, a third layer composite 30 can be produced according to an embodiment. The result of this step is illustrated in FIG. 7. The third layer composite 30 can, as illustrated in FIG. 7, comprise a second substrate 31 made of an electrically conductive material, for example, and a second layer 32 made of an insulating material, for example. Also other material combinations are possible, for example, the second substrate 31 can consist of an electrically insulating material, and the second layer 32 of an electrically conductive material. In this connection, the term "substrate" describes structures, which consist of one material only, for example, a silicon wafer or a glass plate, which, however, can also include a composite of a plurality of layers and materials. However, the third layer composite 30 can also consist of a second substrate 31 only.

The third layer composite 30 preferably has at least a second depression 310, which is formed in a first surface 311 of the third layer composite 30. The second depression 310 has a depth which is smaller than a thickness of the third layer composite 30. The third layer composite 30 can also have several second depressions 310 as well as further depressions, whereas the further depressions can have the same depth as the second depression 310 or a depth different therefrom.

The step of producing the third layer composite 30 is chronologically independent of the previously described process steps, and can be made prior to or following individual or all previously described process steps.

Figure 8:
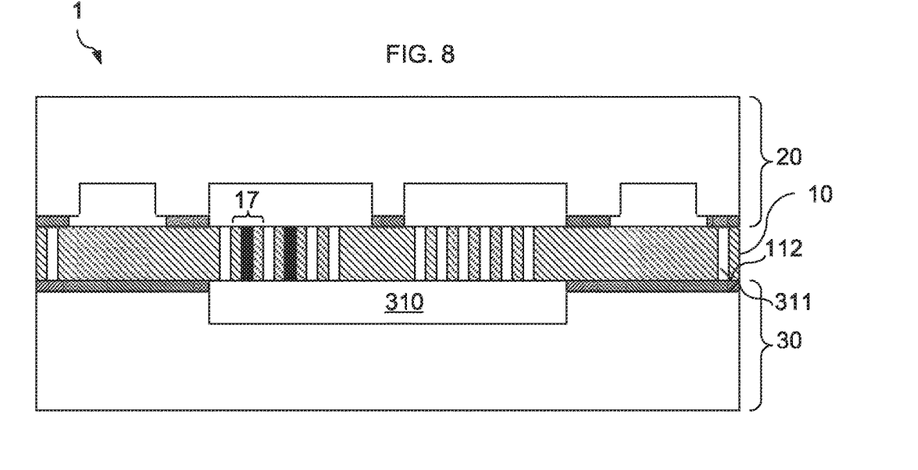
FIG. 8 shows the component from FIG. 6 in cross section after connecting the component to the third layer composite from FIG. 7.

In a further process step, whose result is illustrated in FIG. 8, the already available component 1, which comprises the first layer composite 10 and the second layer composite 20 and in which the active structure 17 is formed, is connected to the third layer composite 30. For the illustration in FIG. 8, the embodiment of the component 1 illustrated in FIG. 6 has been selected. However, the first layer composite 10 and the second layer composite 20 can be formed arbitrarily, as described above. As a result, the second surface 112 of the first layer composite 10 adjoins the first surface 311 of the third layer composite 30 at least in some regions, with the active structure 17 being arranged within the lateral position of the second depression 310 in the third layer composite 30. Thus, it is ensured that the active structure 17 can move freely with regard to the third layer composite 30 and does not abut on the first surface 311 of the third layer composite 30.

For connecting the first and the third layer composite 10 and 30, joining processes on the basis of direct bonding processes as well as anodic bonding processes can be used, for example. This enables a hermetically sealed connection of the first and of the third layer composite 10 and 30 to each other. As a result, the active structure 17 is encapsulated in a hermetically sealed manner.

It is particularly advantageous for a bonding process, if the layers of the first layer composite 10 and of the third layer composite 30 to be connected to each other consist of the same material. This means, the layer of the first layer composite 10 facing the third composite layer 30, and the layer of the third layer composite 30 facing the first composite layer 10 can consist of the same material, for example, silicon.

Figure 9:
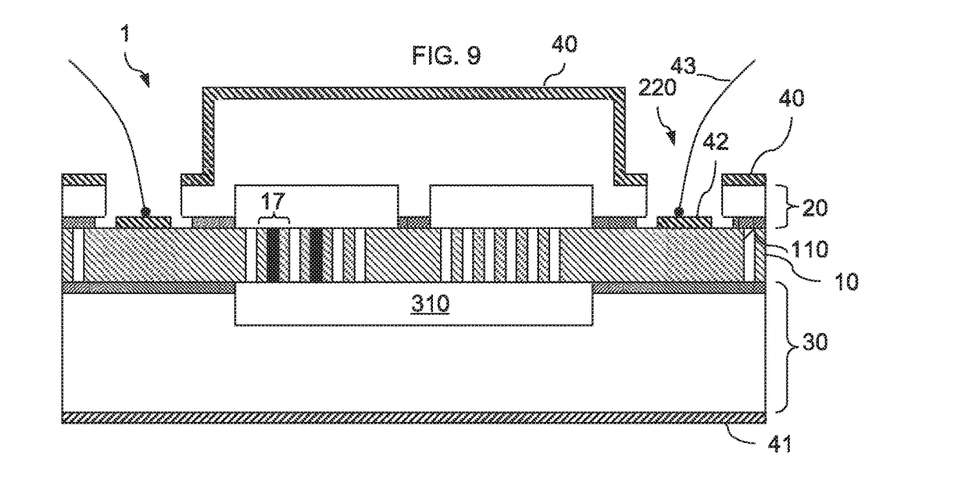
FIG. 9 shows the component from FIG. 8 in cross section following further process steps according to an embodiment of the method.

Subsequently, further process steps for finishing the component 1 can be carried out, whose result is illustrated in an embodiment in FIG. 9. For example, a first cover layer 40 can be applied to the second layer composite 20, and a second cover layer 41 to the third layer composite 30. The first and the second cover layer 40 and 41 can consist of the same material, for example, a metal, or of different materials. They can serve the shielding of an active area of the component 1 from external electrical fields or other environmental impacts, such as humidity, for example. In addition, contact surfaces 42 for electrically contacting the first layer composite 10, in particular, the structured layer 11, as well as electrical contacts 43 can be produced. For example, a metal layer can be produced on the first surface 110 of the first layer composite 10 as a contact surface 42 in a third depression 220 in the second layer composite 20 and electrically contacted by means of a wire 43. However, also other methods for producing an electrical contact to the first layer composite 10 are possible.

Figure 10:
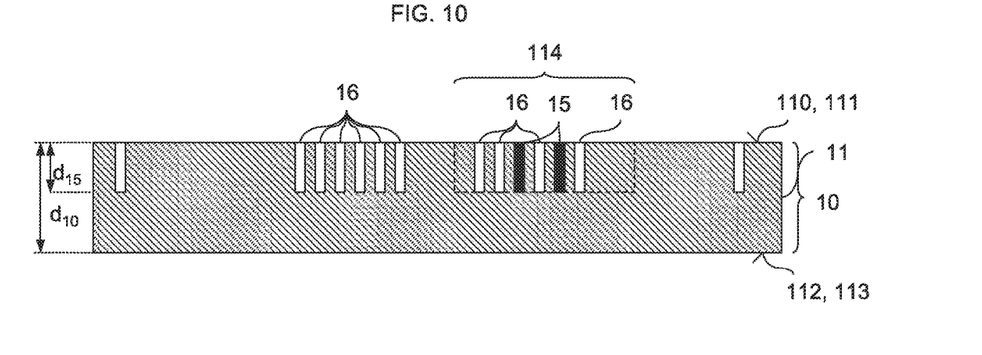
FIG. 10 shows a first layer composite according to another embodiment of the method in cross section.

As already mentioned, also further structures in addition to the filled trench(es) 15 can be produced in the first layer composite 10 prior to connection to the second layer composite 20. An exemplary embodiment is illustrated in FIG. 10. There the first layer composite 10 has a plurality of dividing trenches 16, which are not filled with a material. The dividing trenches 16 extend outwards from the first surface 110 of the first layer composite 10 to a depth, which preferably is equal to or greater than the depth d15 of the filled trenches 15, but smaller than the thickness d10 of the first layer composite. The dividing trenches 16 are arranged so that they delineate one or more regions of the structured layer 11, with each region corresponding to an active structure of the component.

Similarly as in FIG. 2, the first layer composite 10 can also have an auxiliary layer 13, with the dividing trenches 16 preferably extending to the second surface 113 of the structured layer 11.

In addition, the dividing trenches 16 can also extend outwards from the first surface 111 of the structured layer 11. This means, when there is an additional layer on the surface 111 of the structured layer 11, then the dividing trenches 16 need not necessarily extend outwards from the first surface 110 of the first layer composite 10.

Figure 11:
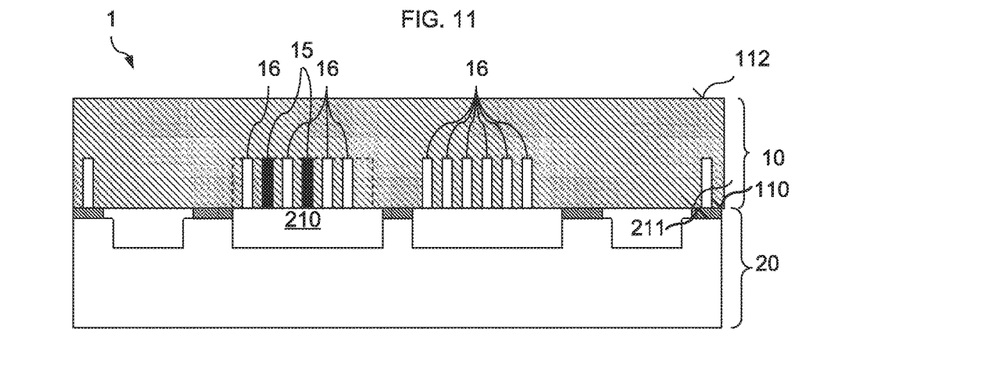
FIG. 11 shows a component according to an embodiment of the method in cross section after connecting the first layer composite from FIG. 10 and the second composite layer.

FIG. 11 shows a component 1 after connecting the first layer composite 10 illustrated in FIG. 10 to the second layer composite 20 illustrated in FIG. 3. Since the dividing trenches 16 preferably do not extend to the second surface 112 of the first layer composite 10, and, thus, do not significantly interfere with the stability of the first layer composite 10, particularly suited methods and process parameters, as described with reference to FIG. 4, can also be used to connect the first layer composite 10 to the second layer composite 20.

Subsequent to the step of connecting the first layer composite 10 to the second layer composite 20, the first layer composite 10 is thinned outwards from the second surface 112 of the first layer composite 10. For this purpose, preferably chemo-mechanical polishing (CMP) processes and etching processes lend themselves. The thickness of the first layer composite 10 is reduced to a thickness, which corresponds to the depth d15 of the filled trenches 15, so that the filled trenches 15 adjoin the second surface 112 of the first layer composite 10. During thinning of the first layer composite 10, the dividing trenches 16 on the second surface 112 of the first layer composite 10 are opened at the same time, whereby the active structures 17 and the other structures 18 can be produced. The result of this process step is illustrated in FIG. 12.

If the dividing trenches 16, as described above, do not extend outwards from the first surface 110 of the first layer composite 10, the dividing trenches 16 must subsequently still be opened to the first surface 110 of the first layer composite 10, so that a mobile active structure 17 is produced. This can be effected by an etching process, where the aforedescribed additional layer, which covers the dividing trenches 16 on the first surface 110 of the first layer composite 10, is removed at least in the regions of the dividing trenches 16.

Figure 12:
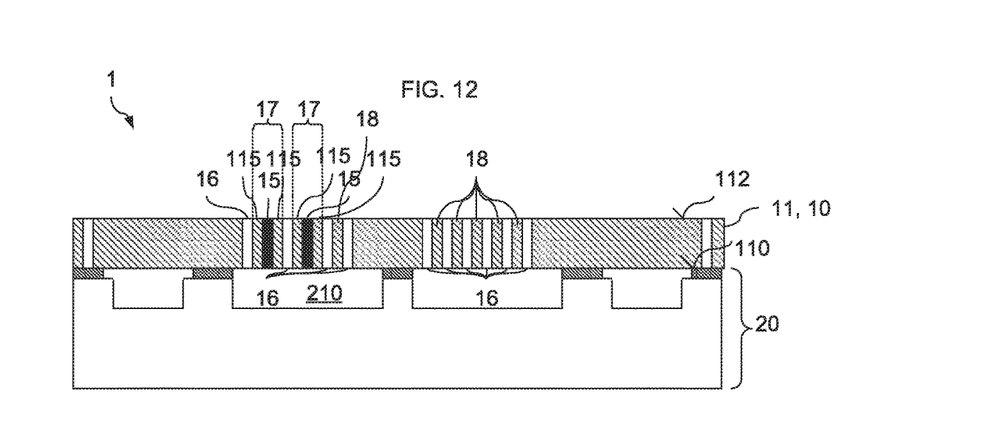
FIG. 12 shows the component from FIG. 11 in cross section after reducing the thickness of the first layer composite.

The further processing of the component 1 illustrated in FIG. 12 is identical as described with reference to FIGS. 8 and 9, with the third layer composite 30 illustrated in FIG. 7 being used.

In addition to the embodiments illustrated in FIGS. 1 to 3 as well as 7 and 10, further embodiments of the first layer composite 10, of the second layer composite 20, and of the third layer composite 30 are possible as well as many different combinations of those embodiments. For example, conducting path bridges, which connect individual electrically conductive, but physically separate regions of the first layer composite 10 to each other in an electrically conductive manner, or electrodes, which have a specific potential and, for example, can serve as detectors or movement restrictors, can be formed within the second layer composite 20 or the third layer composite 30.

The method for producing the component 1 according to the invention enables the production of an active structure of the component with two separate parts or regions, which are mechanically connected to each other in a rigid manner, but are fully electrically insulated from each other.

Furthermore, the tightness of the hermetic encapsulation of the active area of the component 1 can be ensured. In particular, suited joining parameters can be selected during a joining process for connecting the first layer composite 10 to the second layer composite 20, since the first layer composite 10, during connection to the second layer composite 20, has a thickness, which is greater than the depth of the filled trenches 15, and thus a high stability.

What is claimed is:

1. A method for producing a component, comprising:
    producing a first layer composite, the first composite layer comprising
        a structured layer that is electrically conductive at least in a first region, and
        a trench filled with an insulating material that extends outwards from a first surface of the structured layer and is arranged in the first region of the structured layer,
        the first surface of the structured layer facing a first surface of the first layer composite,
    producing a second layer composite having a first depression in a first surface of the second layer composite,
    connecting the first layer composite to the second layer composite, with the first surface of the first layer composite adjoining the first surface of the second layer composite at least in some regions, and the filled trench being arranged within the lateral position of the first depression,
    after the first layer composite has been connected to the second layer composite, reducing the thickness of the first layer composite from a second surface of the first layer composite to the depth of the filled trench, the second surface of the first layer composite lying opposite the first surface of the first layer composite,
    producing an active structure of the component in the structured layer, the active structure being arranged within the lateral position of the first depression and comprising two second regions of the structured layer, which are arranged in the first region of the structured layer, are physically connected to each other in a rigid manner, and are electrically insulated from each other by means of the filled trench, the active structure being produced by structuring the structured layer after the thickness of the first layer composite has been reduced to the depth of the filled trench,
    producing a third layer composite having a first surface of the third layer composite, and
    after the active structure has been produced, connecting the first layer composite to the third layer composite, the first surface of the third layer composite adjoining the second surface of the first layer composite at least in some regions,
    wherein, in addition to the filled trench, no further structures are formed in the first layer composite prior to connecting the first layer composite to the second layer composite.

2. The method of claim 1, further comprising:
    prior to connecting the first layer composite to the second layer composite, extending the filled trench in the first layer composite to a depth that is smaller than a thickness of the first layer composite.

3. The method of claim 2, wherein
the first layer composite further comprises an auxiliary layer that adjoins a second surface of the structured layer with the second surface of the structured layer lying opposite the first surface of the structured layer, and
the filled trench extends to the second surface of the structured layer.

4. The method of claim 1, further comprising:
prior to connecting the first layer composite to the third layer composite, producing a second depression in the first surface of the third layer composite, and
during connecting the first layer composite to the third layer composite, arranging the active structure within the lateral position of the second depression.

5. The method of claim 1, wherein
the layer of the first layer composite facing the third composite layer and the layer of the third layer composite facing the first composite layer consist of the same material.

6. The method of claim 1, wherein
the layer of the first layer composite facing the second composite layer and the layer of the second layer composite facing the first composite layer consist of the same material.

* * * * *